United States Patent
Fudeta

(10) Patent No.: US 7,352,009 B2
(45) Date of Patent: Apr. 1, 2008

(54) LIGHT EMITTING NITRIDE SEMICONDUCTOR DEVICE AND METHOD OF FABRICATING THE SAME

(75) Inventor: Mayuko Fudeta, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 352 days.

(21) Appl. No.: 11/100,643

(22) Filed: Apr. 6, 2005

(65) Prior Publication Data

US 2005/0224833 A1 Oct. 13, 2005

(30) Foreign Application Priority Data

Apr. 7, 2004 (JP) ............... 2004-112784

(51) Int. Cl.
*H01L 29/22* (2006.01)
*H01L 33/00* (2006.01)

(52) U.S. Cl. ............ 257/94; 257/97; 257/100
(58) Field of Classification Search ........ 257/94, 257/97, 100
See application file for complete search history.

(56) References Cited

U.S. PATENT DOCUMENTS 6,452,216 B1 * 9/2002 Tsuda et al. ............ 257/94
6,844,572 B2 * 1/2005 Sawaki et al. ............ 257/94
2003/0178702 A1 * 9/2003 Sawaki et al. ............ 257/622
2005/0269592 A1 * 12/2005 Lee et al. ............ 257/100

FOREIGN PATENT DOCUMENTS

| JP | 08-274372 | 10/1996 |
| JP | 11-168235 | 6/1999 |
| WO | WO-98/18167 | 4/1998 |

\* cited by examiner

Primary Examiner—Fernando L. Toledo
(74) Attorney, Agent, or Firm—Morrison & Foerster LLP

(57) ABSTRACT

There is provided a light emitting nitride semiconductor device including a substrate, a semiconductor layer of a first conductivity overlying the substrate, a light emitting layer overlying the semiconductor layer of the first conductivity, a semiconductor layer of a second conductivity overlying the light emitting layer, and a second electrode overlying at least the semiconductor layer of the second conductivity, wherein the second electrode has a high reflectance for a main light emission wavelength and the light emitting device allows light to be extracted mainly at a side surface thereof.

18 Claims, 8 Drawing Sheets

32

LIGHT EMITTING NITRIDE SEMICONDUCTOR DEVICE AND METHOD OF FABRICATING THE SAME

This nonprovisional application is based on Japanese Patent Application No. 2004-112784 filed with the Japan Patent Office on Apr. 7, 2004, the entire contents of which are hereby incorporated by reference.

BACKGROUND OF THE INVENTION

1. Field of the Invention

The present invention relates to light emitting nitride semiconductor devices employing a nitride compound semiconductor ($In_xAl_yGa_{1-x-y}N$, where $0 \leq X$, $0 \leq Y$, and $X+Y<1$).

2. Description of the Background Art

A conventional light emitting nitride semiconductor device's structure described in Japanese Patent Laying-Open No. 08-274372 is shown in FIG. 11. In the figure the conventional light emitting device has a sapphire substrate 101 and thereon a buffer layer 102 of $Al_{0.1}Ga_{0.83}In_{0.07}N$ of 500 Å is deposited. On buffer layer 102 an $n^+$ layer 103 is formed of silicon doped GaN and having a thickness of approximately 2.0 μm and an electron density of $2 \times 10^{18}/cm^3$. On $n^+$ layer 103 excluding a portion provided with an electrode 201 are sequentially deposited an $n^+$ layer 104 of high carrier concentration formed of silicon doped $(Al_{x2}Ga_{1-x2})_{y2}In_{1-y2}N$ and having a thickness of approximately 2.0 μm and an electron density of $2 \times 10^{18}/cm^3$, a light emitting layer 105 of p conductivity formed of magnesium (Mg), cadmium (Cd) and silicon doped $(Al_{x1}Ga_{1-x1})_{y1}In_{1-y1}N$ and having a thickness of approximately 0.5 μm, a $p^+$ layer 106 formed of Mg doped $(Al_{x2}Ga_{1-x2})_{y2}In_{1-y2}N$ having a Mg content of $1 \times 10^{20}/cm^3$ and a hole density of $5 \times 10^{17}/cm^3$, and having a thickness of approximately 1.0 μm, a second contact layer 107 formed of Mg doped GaN having a Mg content of $1 \times 10^{20}/cm^3$ and a hole density of $5 \times 10^{17}/cm^3$, and having a thickness of approximately 0.2 μm, and a first contact layer 108 formed of Mg doped GaN having a Mg content of $2 \times 10^{20}/cm^3$ and a hole density of $2 \times 10^{17}/cm^3$, and having a thickness of approximately 500 Å.

Furthermore there are also deposited an electrode 202 connecting to the first contact layer 108 and electrode 201 connecting to $n^+$ layer 103 on an exposed surface. Electrode 202 includes on the first contact layer 108 a layer 109 of titanium (Ti) deposited to have a uniform thickness of 20 Å and a layer 110 of nickel (Ni) deposited to have a thickness of 60 Å. These two layers function as a transparent electrode. Layer 110 has a portion having deposited thereon a layer 111 of Ni having a thickness of 1,000 Å and functioning as a pad having a wire bonded thereto and a layer 112 of gold (Au) having a thickness of 1.5 μm. Electrode 201 has a 3-layer structure formed of a layer 113 of aluminum (Al) having a thickness of 500 Å and bonded on $n^+$ layer 103, a layer 114 of Ti having a thickness of 5,000 Å and a layer 115 of Au having a thickness of 1.5 μm.

In such a light emitting nitride semiconductor device's structure an LED has an upper surface with layer 109 of Ti and 20 Å in thickness and layer 110 of Ni and 60 Å in thickness deposited in two layers to serve as a transparent electrode. These thin metal films, however, provide poor reflectance and transmittance and absorb a large quantity of light, resulting in poor optical extraction efficiency.

As another example, Japanese Patent Laying-Open No. 11-168235 describes a light emitting nitride semiconductor device having a structure as shown in FIG. 12. With reference to the figure, on a substrate 121 an interconnect pattern 122 is provided and thereon via a bump 125 an LED chip 123 is mounted. LED chip 123 has a bottom surface provided with a reflection layer 124, and thereunder underfill resin 126 is introduced.

The light emitting nitride semiconductor device thus structured provides improved optical extraction efficiency by reflecting light by reflection layer 124 to extract the light at a surface which is not provided with an electrode of LED chip 123. However, as chip 123 and layer 124 are mounted on the substrate via bump 125, it is difficult to align interconnect pattern 122 and bump 125, resulting in poor yield.

The present invention has been made to overcome the above described conventional technological disadvantage and it contemplates a light emitting nitride semiconductor device that allows light generated by the device to be extracted more efficiently and also provides satisfactory yield, and a method of fabricating the same.

SUMMARY OF THE INVENTION

The present invention in one aspect provides a light emitting nitride semiconductor device including a substrate, a semiconductor layer of a first conductivity overlying the substrate, a light emitting layer overlying the semiconductor layer of the first conductivity, a semiconductor layer of a second conductivity overlying the light emitting layer, and a second electrode overlying at least the semiconductor layer of the second conductivity, wherein the second electrode has a high reflectance for a main light emission wavelength and the light emitting device allows light to be extracted mainly at a side surface thereof, and a method of fabricating the light emitting nitride semiconductor device.

The electrode of high reflectance absorbs less light from the light emitting device, allowing light to be extracted more efficiently. Furthermore, as the device allows light to be extracted mainly at a side surface thereof, a side opposite to the electrode bearing surface can be mounted for example on a lead frame and the surface can have a wire bonded thereto, providing increased yield associated with mounting.

Preferably the second electrode has a reflectance of at least 70% for the main light emission wavelength. Increased light emission efficiency can be achieved. A reflectance less than 70% is not preferable as the electrode portion would absorb a large quantity of light and thus contribute to reduced light emission efficiency.

Preferably the second electrode covers at least 60% of a surface defined by the semiconductor layer of the first conductivity and the semiconductor layer of the second conductivity. An increased light emission area and hence increased light emission efficiency can be achieved.

Preferably the substrate is transparent to the main light emission wavelength. The transparent substrate allows light to travel therethrough and output at a side surface thereof, which provides an increased output area and hence more efficient output.

Preferably the substrate has a surface opposite and non-parallel to that bearing the semiconductor layer of the first conductivity or having protrusion and depression. The substrate's opposite surface can reflect light obliquely to guide the light efficiently to a side surface of the device and thus extract it more efficiently, or the substrate's protrusion and depression can scatter light to efficiently guide the light to a side surface of the device and thus extract it more efficiently.

Preferably a substance having a high reflectance for the main light emission wavelength covers a surface of the substrate opposite to that bearing the semiconductor of the first conductivity. The opposite surface hardly absorbs light and thus guides the light to a side surface of the device to extract it more efficiently.

Preferably the substrate is a sapphire substrate. The substrate does not lose light therein and thus allows it to be extracted more efficiently.

Preferably the second electrode is a p type electrode containing Ag. The second electrode can have a good ohmic contact with a p layer and can also have a high reflectance and thus hardly absorbs light so that while the device's electrical characteristics can satisfactorily be maintained the device allows light to be extracted more efficiently.

Preferably the first electrode is an n type electrode containing Al. The first electrode can have a good ohmic contact with an n layer and can also have a high reflectance and thus hardly absorbs light so that while the device's electrical characteristics can satisfactorily be maintained the device allows light to be extracted more efficiently.

Preferably the semiconductor of the first conductivity is an n type semiconductor and the semiconductor of the second conductivity is a p type semiconductor. As compared with p type semiconductor, n type semiconductor is relatively low in resistance and thus passes a current laterally so that an increased light emission area can be achieved with low resistance and while the device's electrical characteristics can satisfactorily be maintained, increased light emission efficiency can also be achieved.

Preferably, when a sapphire or similarly insulative substrate is used and the first electrode is deposited to overlie the semiconductor layer of the first conductivity the first electrode is positioned in the light emitting nitride semiconductor device substantially at a center, as seen at a top surface of the device downward. The region of the electrode of the first conductivity, which does not contribute to light emission, is located at a region corresponding to the device's center remote from a side surface of the device. Reduced optical loss and hence increased light emission efficiency can be achieved.

Preferably a conical hole is formed in a surface of the substrate opposite to that bearing the semiconductor of the first conductivity. The conical geometry reflects light to thus efficiently guide the light to a side surface of the device to extract the light more efficiently.

Preferably the conical hole is formed at a center of the surface of the substrate opposite to that bearing the semiconductor of the first conductivity. This allows an upper surface of the device that is not provided with the electrode to also efficiently reflect light and thus guide the light to a side surface of the device to extract the light more efficiently.

Preferably the conical hole has an apex in contact with the electrode of the first conductivity. High reflectance allows light to be extracted more efficiently.

Preferably a film having a high reflectance for the main light emission wavelength is deposited on an upper surface of the light emitting nitride semiconductor device at a portion free of the first electrode and/or the second electrode and thus exposing the semiconductor layer of the first conductivity and/or the semiconductor layer of the second conductivity and at a portion on the electrode. This can achieve high reflectance without short-circuiting the n and p type layers and allows light to be extracted more efficiently. The film of high reflectance is formed from a portion exposing the semiconductor layer to a portion on the electrode to prevent misalignment from exposing the semiconductor layer.

Preferably the substance of high reflectance contains Ag or Al.

Preferably the substance of high reflectance is a dielectric containing multi-layer film.

Preferably the substance of high reflectance has a reflectance of at least 70% for the main light emission wavelength. This allows the device to have an upper surface entirely having high reflectance to allow light to be extracted at a side surface of the device efficiently.

Preferably the second electrode contains Ag and has a thickness of at least 10 nm. High reflectance can be maintained and light can be extracted more efficiently. A thickness of at most 10 nm is not preferable because of reduced reflectance.

The present invention in another aspect provides a method of fabricating a light emitting nitride semiconductor device, including the steps of: depositing a semiconductor layer of a first conductivity on a substrate; depositing a light emitting layer on the semiconductor layer of the first conductivity; depositing a semiconductor layer of a second conductivity on the light emitting layer; depositing a second electrode on the semiconductor layer of the second conductivity; and partially etching the second electrode, the semiconductor layer of the second conductivity, the light emitting layer and the semiconductor layer of the first conductivity, and depositing a first electrode at a portion thus etched.

An electrode can be formed that can maintain satisfactory ohmic and also have high reflectance. A device having satisfactory electrical characteristics and satisfactory light emission efficiency can thus be fabricated.

Preferably the step of depositing the second electrode includes the step of depositing at least one of metals of Pd, Pt and Ni in a layer(s), depositing thereon a film of Ag having a thickness of at least 10 nm, and subsequently thermally treating the same at least 400° C.

The present light emitting nitride semiconductor device and method of fabricating the same can achieve satisfactory optical extraction efficiency and satisfactory production yield.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The present invention provides a light emitting nitride semiconductor device including a substrate, and thereon a semiconductor layer of a first conductivity, then a light emitting layer and then a semiconductor layer of a second conductivity. The semiconductor layer of the first conductivity has a first electrode deposited thereon and the semiconductor layer of the second conductivity has a second electrode deposited thereon. The first and second electrodes have high reflectance for a main light emission wavelength and mainly light is extracted at a side surface of the device. Light generated by the device can thus be extracted more efficiently and good production yields can also be achieved.

Figure 1:
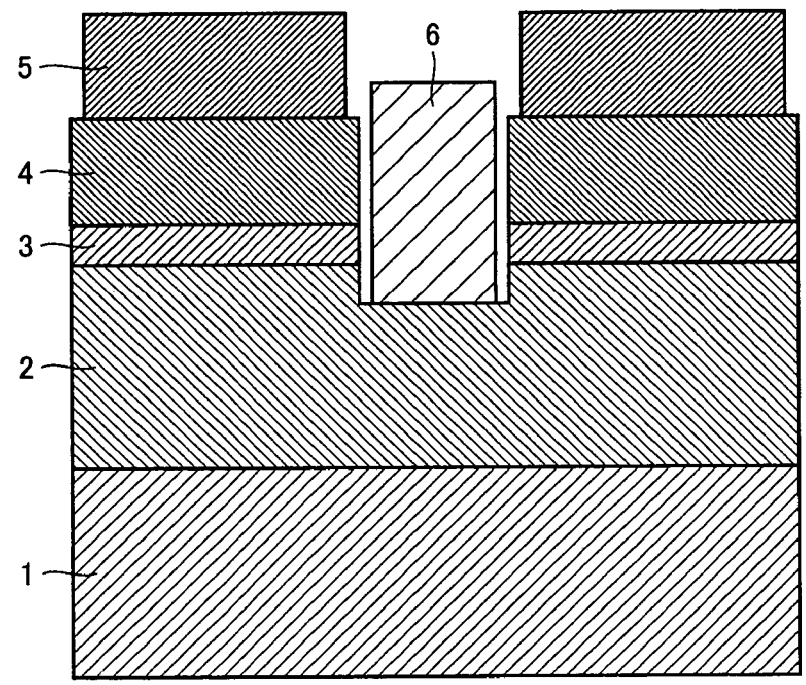
FIGS. 1 and 2 are schematic cross sections of structures, respectively, of the present light emitting nitride semiconductor device.

FIG. 1 is a schematic cross section of a structure of the present light emitting nitride semiconductor device. With reference to the figure, on a substrate 1 a semiconductor layer of a first conductivity 2 is deposited. On semiconductor layer 2 a light emitting layer 3 is deposited. On light emitting layer 3 a semiconductor layer of a second conductivity 4 is deposited. On semiconductor layer 4 a second electrode 5 is deposited. Note that in the figure when the device is seen at a top surface thereof, the device has a center etched away from a top surface to a portion of semiconductor layer 2 and the etched portion is provided with a first electrode 6. The first and second electrodes 6 and 5 do not contact each other. The second electrode is of p type and the first electrode is of n type.

The first and second electrodes 6 and 5 have high reflectance. Furthermore the second and first electrodes 5 and 6 cover a major portion of an upper surface defined by semiconductor layers 4 and 2 together. This allows light generated by the device to be reflected by the electrodes and thus extracted through a side surface of the device to provide improved light emission efficiency. Note that the major portion indicates at least 60%, preferably at least 80%, more preferably at least 90% of the upper surface defined by semiconductor layers 4 and 2 together. Furthermore, the high reflectance of the second and first electrodes 5 and 6 indicates a reflectance of at least 70%, preferably at least 80%, more preferably at least 95%.

In the present invention the main high emission wavelength indicates light ranging from ultraviolet to visible light, and more specifically, it indicates a wavelength falling within a range approximately of 200 nm to 800 nm.

Furthermore the main light emission wavelength's reflectance can be measured for example with a reflectance measurement apparatus by measuring a reflectance of a surface of a reflective film deposited on a flat surface of a substrate.

In the present invention substrate 1 is preferably a sapphire ($\alpha$-$Al_2O_3$) substrate, a GaN substrate or a Si substrate, although it is not limited thereto and it may be formed of Si, GaAs, ZnO or the like. Furthermore in the present invention substrate 1 is preferably transparent to light generated by the light emitting device. Furthermore in the present invention substrate 1 preferably has a surface opposite and non-parallel to that bearing the semiconductor layer of the first conductivity. More specifically, the substrate preferably has the opposite surface that has protrusion and depression.

Furthermore in the present invention the substrate preferably has the opposite surface covered with a substance having high reflectance for the main light emission wavelength. The substance can be a dielectric containing multilayer film. More specifically, it can include a layer of a high index of refraction formed of $TiO_x$ (e.g., $TiO_2$) and a layer of a low index of refraction formed of $SiO_x$ (e.g., $SiO_2$) that are alternately deposited.

Furthermore in the present invention the semiconductor layer of the first conductivity 2 and the semiconductor layer of the second conductivity 4 are formed of nitride semiconductor. More specifically, it can include GaN, AlN, AlGaN, and the like. Furthermore, semiconductor layers 2 and 4 are preferably n and p semiconductor layers, respectively. Furthermore in the present invention light emitting layer 3 can be of InGaN semiconductor.

In the present invention the second electrode 5 can include a first electrode layer of Pd initially deposited and a second electrode layer of Ag subsequently deposited. The first electrode layer may be formed of Pt, Ni or the like. Furthermore when the second electrode 5 is deposited, it is necessary to provide a good ohmic of the semiconductor layer of the second conductivity and the second electrode 5. Furthermore on the second electrode layer a bonding electrode layer formed of Pd and Au can be used. Note that in the present invention the second electrode 5 may be formed of the first and second electrode layers for a total of two layers, as described above, or may be formed of the first electrode layer alone having a thickness larger than that of the first and second electrode layers combined together.

Furthermore in the present invention the first electrode 6 can be formed of Ti and Al. The first electrode 6 is provided substantially at the center as seen at the top surface of the present light emitting device. Note that the top surface of the light emitting device indicates the topmost surface opposite to substrate 1, as seen when substrate 1 is regarded as the bottom surface of the device. More specifically, for the FIG. 1 structure, it corresponds to a surface defined by a portion of the semiconductor layer of the first conductivity and that of the second conductivity combined together. In that case, the surface is not flat but will have a recess.

In the present invention substrate 1 has a surface opposite to that bearing the semiconductor of the first conductivity that has a conical hole since light reflected by the conical geometry is efficiently guided to a side surface of the device and thus more efficiently extracted.

Hereinafter with reference to embodiments the present invention will more specifically be described, although it is not limited thereto.

First Embodiment

Figure 2:
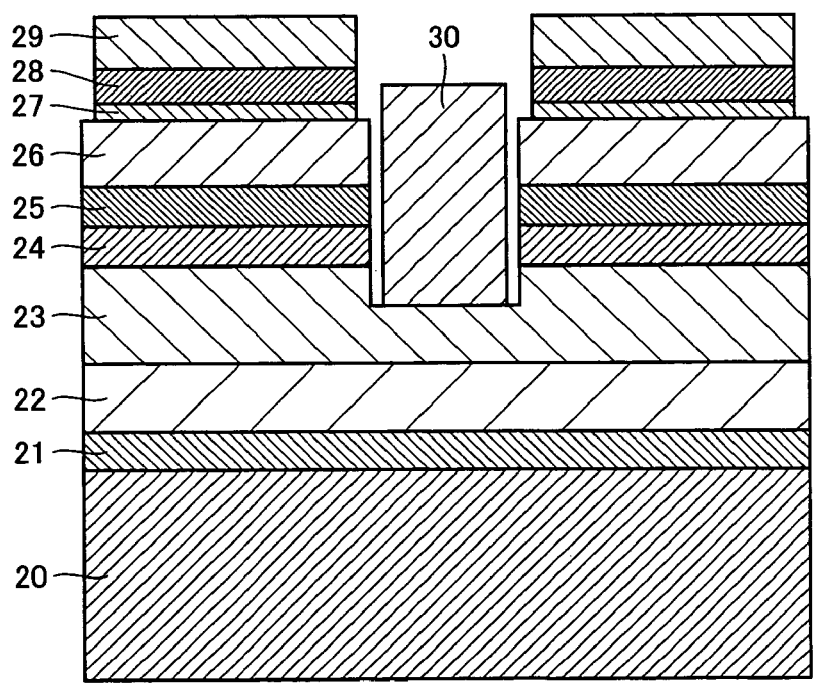
Figure 3:
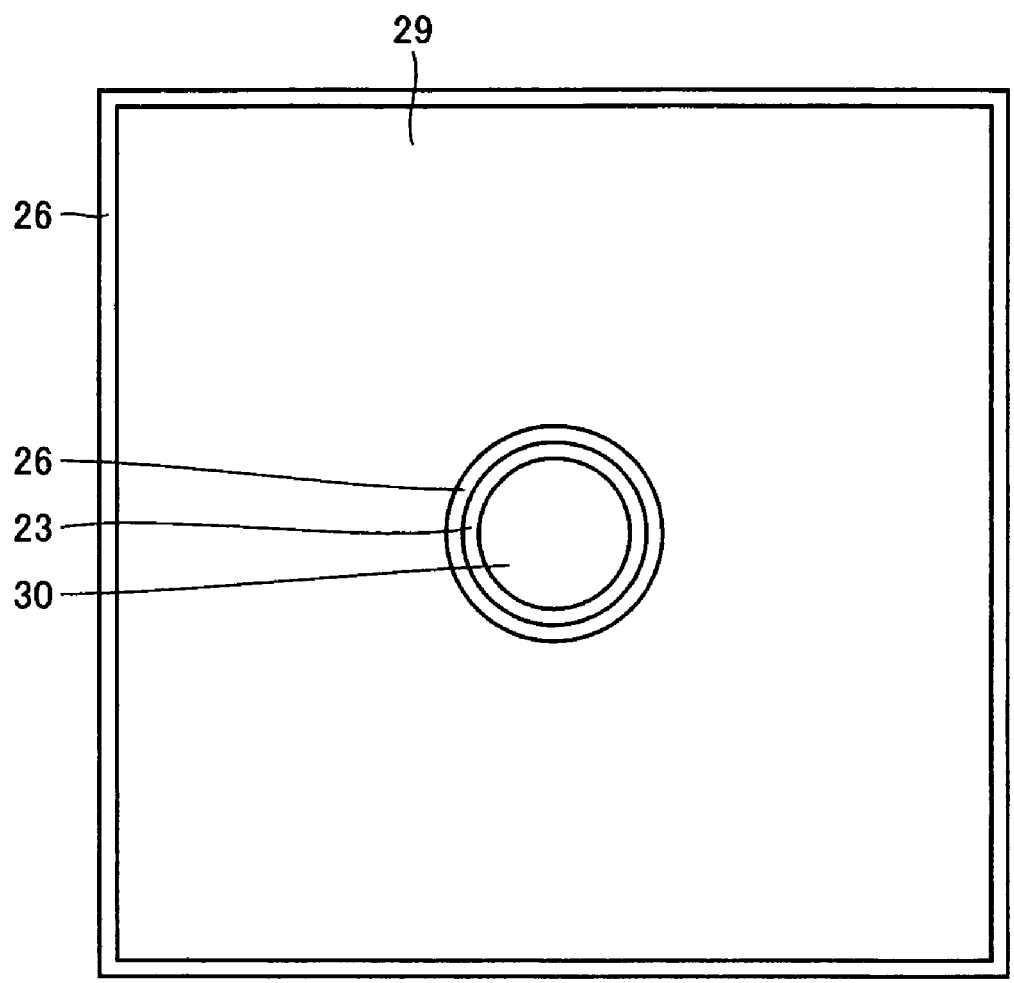
FIG. 3 is a plan view of the FIG. 2 light emitting device as seen at a top surface thereof.

FIG. 2 shows a structure in cross section of the present light emitting device formed of a GaN based compound semiconductor on a sapphire substrate. FIG. 3 is a plan view thereof as seen at a top surface thereof.

On a substrate 20 using sapphire as material a buffer layer 21 of GaN is deposited. Thereon a non doped GaN layer 22 of 1 µm is deposited. Thereon an n GaN layer 23 of silicon doped GaN of 4 µm is deposited. The layers provide an electrode layer of a first conductivity. Furthermore on n GaN layer 23 a barrier layer of GaN and a light emitting, multiple quantum well layer 24 configured of a well layer of InGaN are deposited in layers to provide a light emitting layer. On light emitting layer 24 a p clad layer 25 of p type AlGaN is deposited as an electrode layer of a second conductivity. On p clad layer 25 a p contact layer 6 of p type GaN is deposited.

On p contact layer 26 a second electrode is formed of a first electrode layer 27 formed of a thin Pd film having a thickness of approximately 1.5 nm and a second electrode layer 28 of Ag deposited on the first electrode layer 27 to have a thickness of 100 nm.

The intermediate product is then thermally processed in a vacuum at 500° C. for 3 minutes to provide good ohmic of the second electrode's first and second electrode layers 27 and 28 and p contact layer 26 and also provide high reflectance. Then on the second electrode layer 28 a bonding electrode layer 29 is formed by depositing Pd and Au by vapor deposition to have thickness of 15 nm and 500 nm, respectively.

Then photoresist is applied on an upper surface of electrode and the photoresist located at a prescribed region is removed, and an electrode layer located at a portion uncovered with the photoresist is etched with aqua regia. Furthermore, p contact layer 26, p clad layer 25, light emitting layer 24, and n GaN layer 23 are partially dry-etched away to expose a surface of n GaN layer 23.

Then, photoresist is uniformly applied and n GaN layer 23 has a surface provided with a window at a prescribed region, and an n electrode 30 serving as a first electrode is formed in a film by vapor-depositing Ti of 20 nm and Al of 200 nm and lifting the Al/Ti film off the photoresist to remove the film.

Then, sapphire substrate 20 has a back surface ground to have a thickness of approximately 100 µm. The ground surface is exactly used, rather than polished or the like, to serve as a surface scattering light, such as light radiated from the light emitting layer directly toward the back surface, light reflected by electrode and arriving at the back surface, and the like, to help to guide the light toward a side surface of the device. The ground surface may have protrusion and depression.

The intermediate product is then placed with the electrode bearing side facing upward. The product is then stuck on an adhesive sheet and has the side laser-scribed to divide the device.

Figure 4:
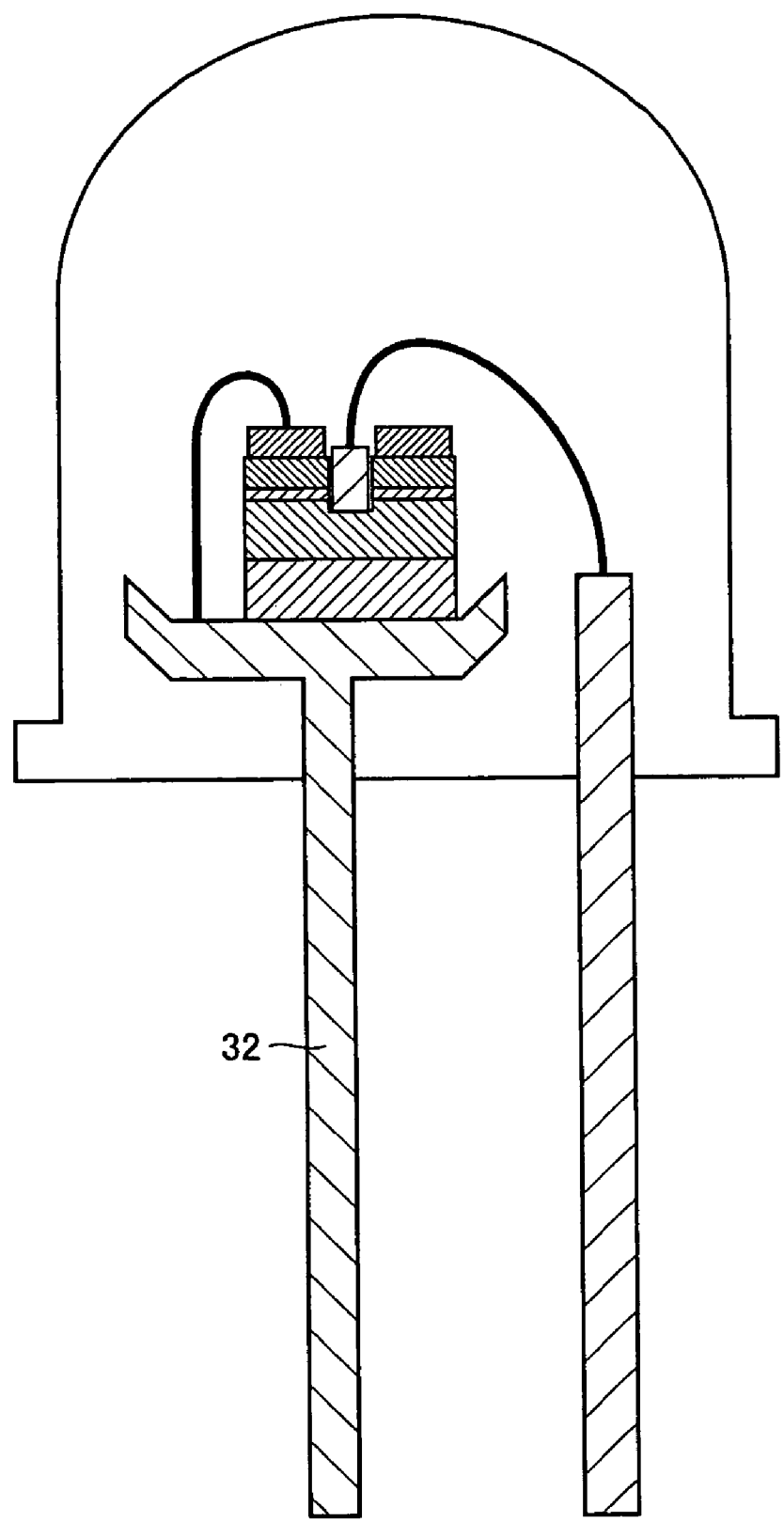
FIG. 4 is a schematic cross section of a lead frame.

The light emitting nitride semiconductor device thus fabricated can be mounted on a lead frame, as shown in FIG. 4, by a conventional method and thus provide good production yield. Furthermore, it can extract light more efficiently than a light emitting diode employing a conventional semi-transparent electrode and thus provide an optical output of approximately 1.5 times. Furthermore, as compared with a thin film electrode, when the present device is driven in a conduction test on low voltage for a long period of time its electrode does not peel off or the like and is thus highly reliable.

Note that the present embodiment employs a buffer layer of GaN, it may employ a buffer layer of AlN. Furthermore the present embodiment designates each film's thickness, each film is not limited in thickness thereto, although the second electrode layer is formed of Ag to have a thickness of preferably at least 10 nm, more preferably at least 50 nm.

Furthermore in the present embodiment the second electrode includes the first electrode layer of Pd, it is not limited thereto and may be formed of Pt, Ni or the like. Furthermore while in the present embodiment the second electrode has a 2-layer structure formed of first and second electrode layers, it may be formed of Pd alone deposited to be large in thickness. If the single layer of Pd is used, it preferably has a thickness of 10 nm, more preferably at least 50 nm.

Furthermore in the present embodiment the light emitting nitride semiconductor device is divided by laser scribing, it may be divided by diamond scribing, dicing or the like.

Second Embodiment

Figure 5:
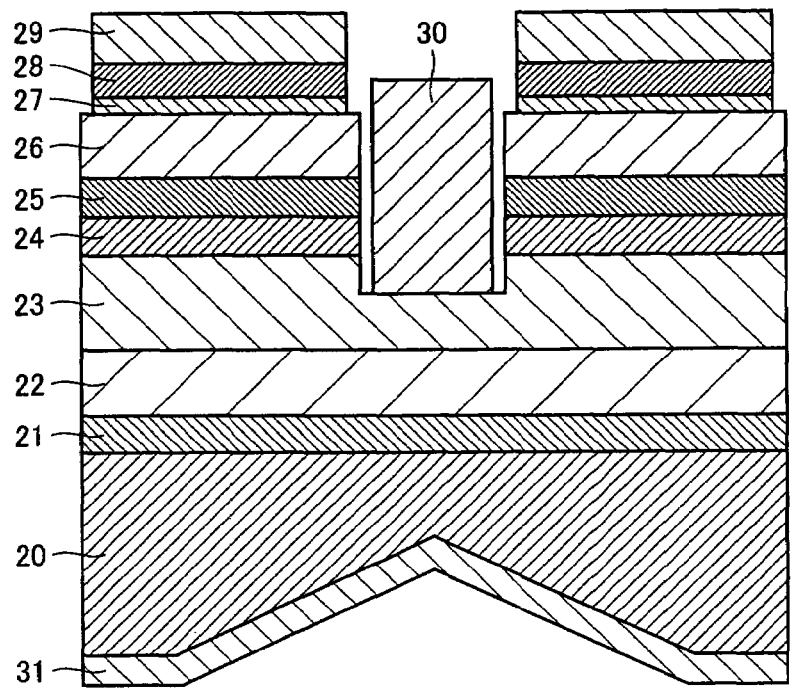
FIG. 5 is a schematic cross section of a structure of the present light emitting nitride semiconductor device.
Figure 6:
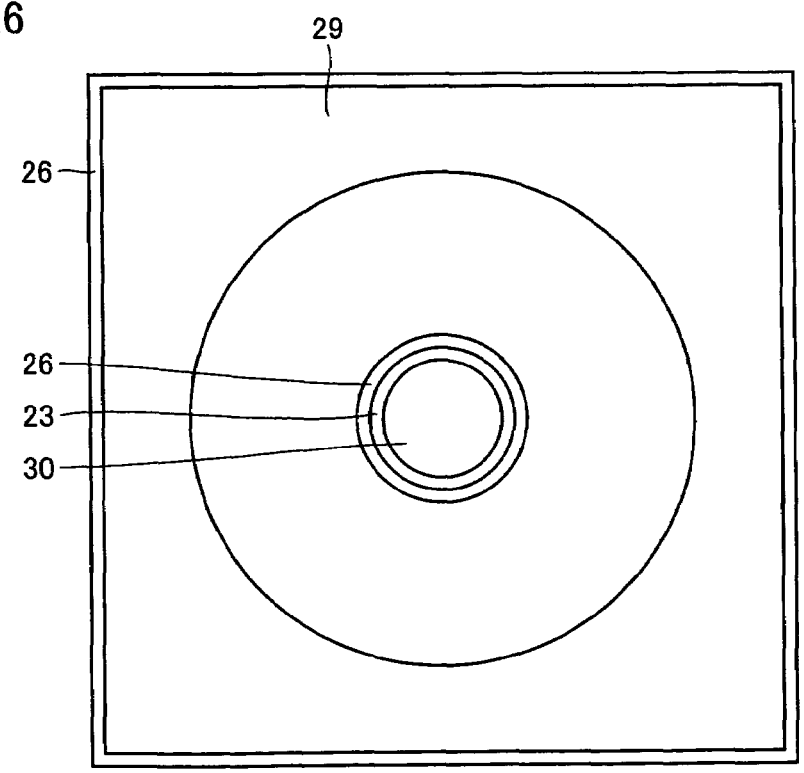
FIG. 6 is a plan view of the FIG. 5 light emitting device as seen at a top surface thereof.

FIG. 5 is a schematic cross section of a structure of the present light emitting nitride semiconductor device and FIG. 6 is a plan view thereof as seen at a top surface thereof. In FIG. 5 the present light emitting device has a structure of a light emitting device formed of a GaN based compound semiconductor deposited on a sapphire substrate.

The present embodiment is similar to the first embodiment up to forming the first electrode. Subsequently, sapphire substrate 20 has a back surface polished to have a conical hole having a top end distant by approximately 50 µm from a surface bearing the electrode. Furthermore, this conical hole is formed at the same pitch as an electrode forming pattern, and the hole's top end is positioned at the center of the electrode pattern.

Then, sapphire substrate 20 has the back surface again polished so that its thickest portion has a thickness of approximately 100 µm. Then, the substrate's back surface is provided with a highly reflective layer 31 of Ag vapor-deposited to have a thickness of 200 nm. The intermediate product is then placed with the electrode bearing side facing upward, and the product is then stuck on an adhesive sheet and has the side laser-scribed to divide the device.

Figure 7:
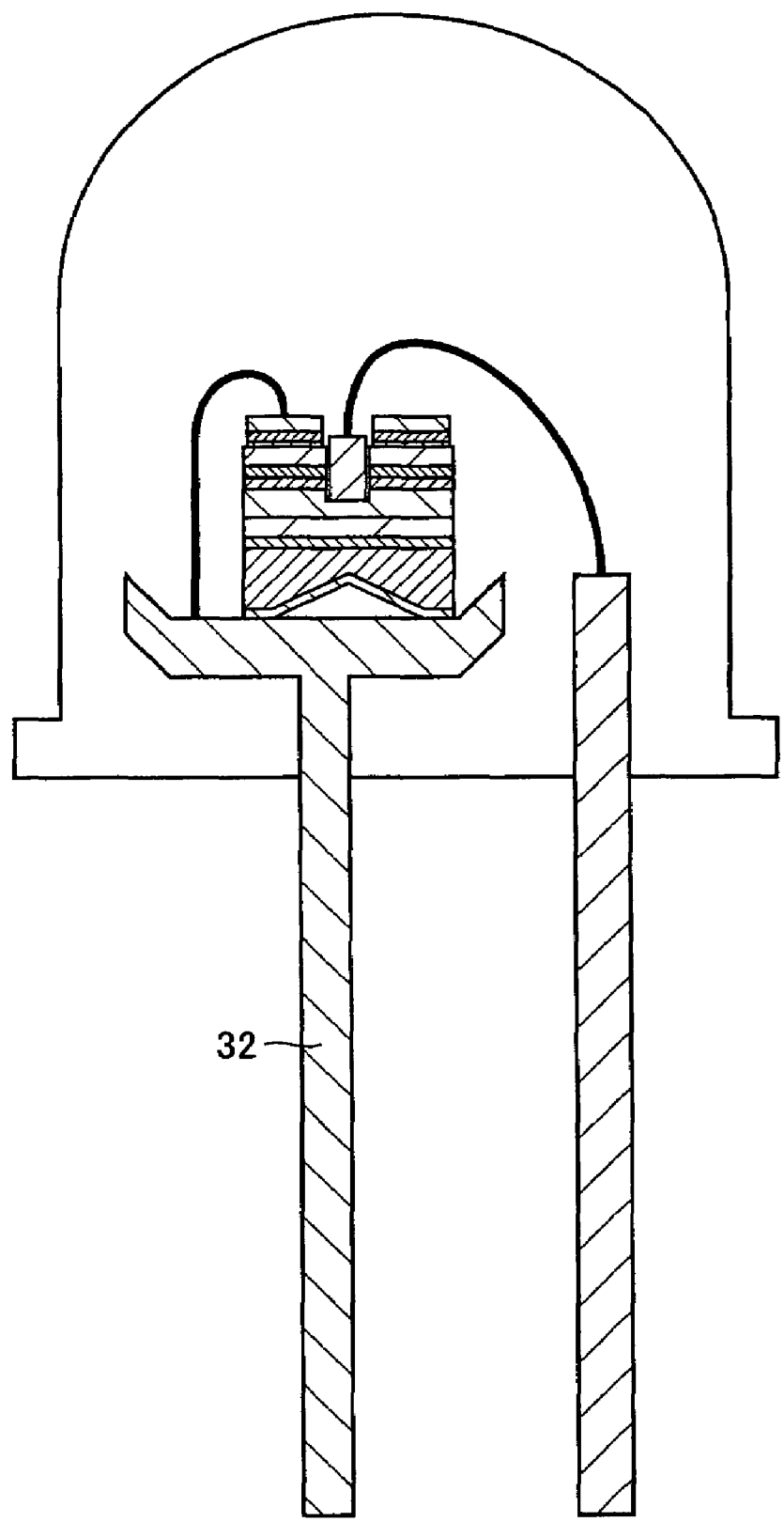
FIG. 7 is a schematic cross section of a lead frame.

The light emitting device thus fabricated can be mounted on a lead frame, as shown in FIG. 7, by a conventional method and thus provide good production yield. Furthermore the device can extract light more efficiently than that using a conventional semi-transparent electrode and thus provide an optical output of approximately two times.

Third Embodiment

Figure 8:
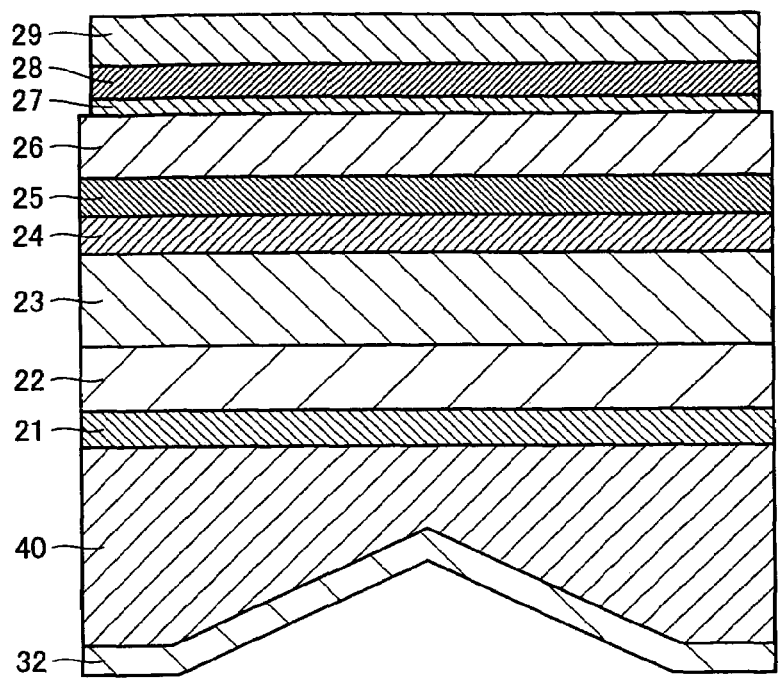
FIG. 8 is a schematic cross section of a structure of the present light emitting nitride semiconductor device.
Figure 9:
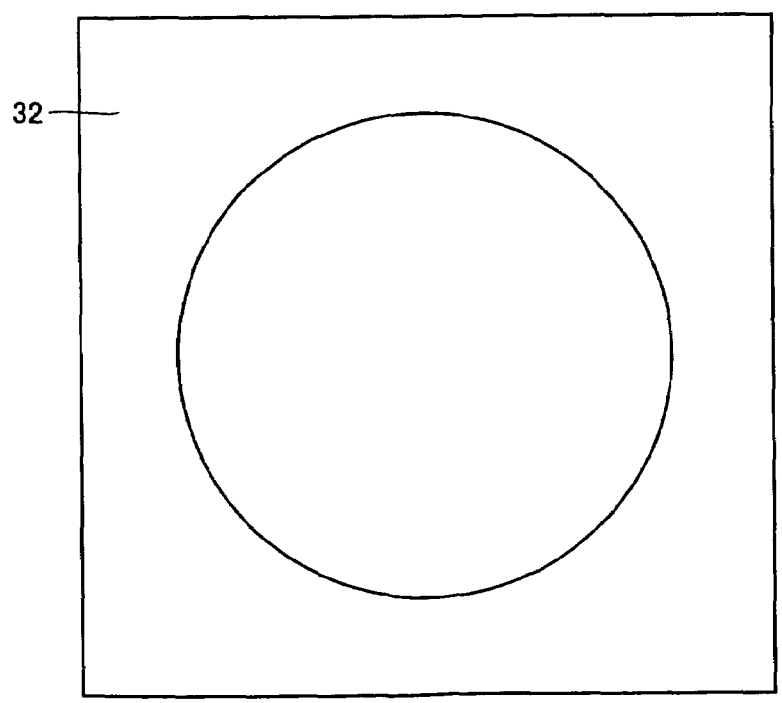
FIG. 9 is a plan view of the FIG. 8 light emitting device as seen at a top surface thereof.

FIG. 8 is a schematic cross section of a structure of the present light emitting nitride semiconductor device and FIG. 9 is a plan view thereof as seen at a bottom surface thereof. In FIG. 8 the present light emitting device has a structure of a light emitting device formed of a GaN based compound semiconductor deposited on a GaN substrate.

The present embodiment is similar to the first embodiment up to forming bonding electrode layer 29. Subsequently, GaN substrate 40 has a back surface polished to have a conical hole having a top end distant by approximately 50 µm from a surface bearing the electrode. Furthermore, this conical hole is formed at the same pitch as a chip's size, and the hole's top end is positioned at the center of the chip.

Then, GaN substrate 40 has the back surface again polished so that its thickest portion has a thickness of approximately 100 µm. Then, the substrate's back surface has an n electrode 32 formed of Ti of 20 nm and Al of 200 nm provided by vapor-deposition. Then the intermediate product is placed with the substrate facing upward, and it is stuck on an adhesive sheet and laser-scribed at the substrate to divide the device.

Figure 10:
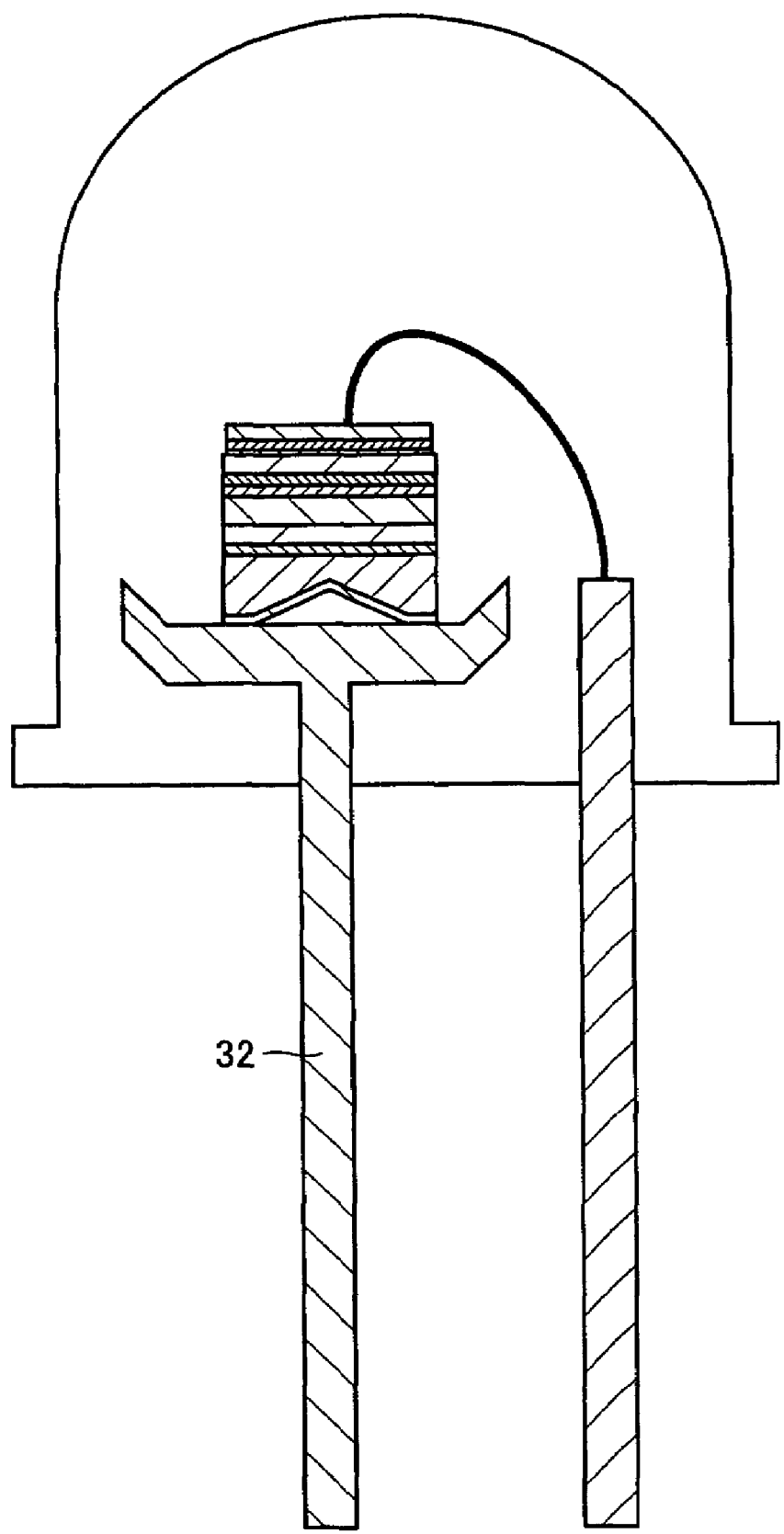
FIG. 10 is a schematic cross section of a lead frame.
Figure 11:
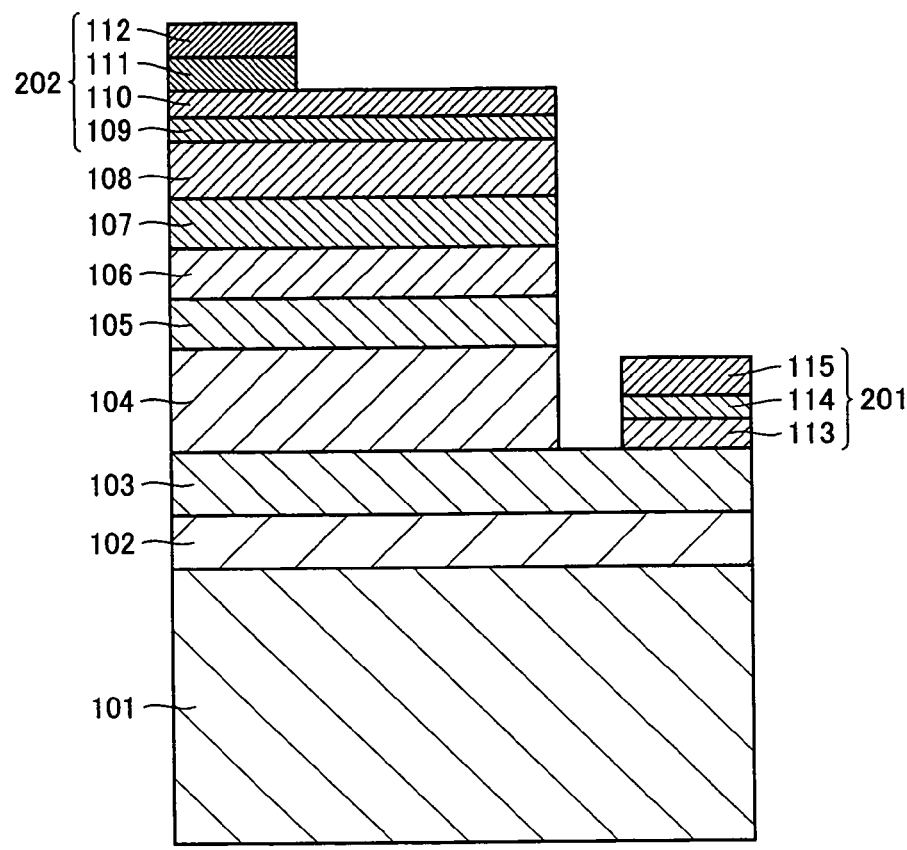
FIGS. 11 and 12 are schematic cross sections of conventional light emitting diodes, respectively.
Figure 12:
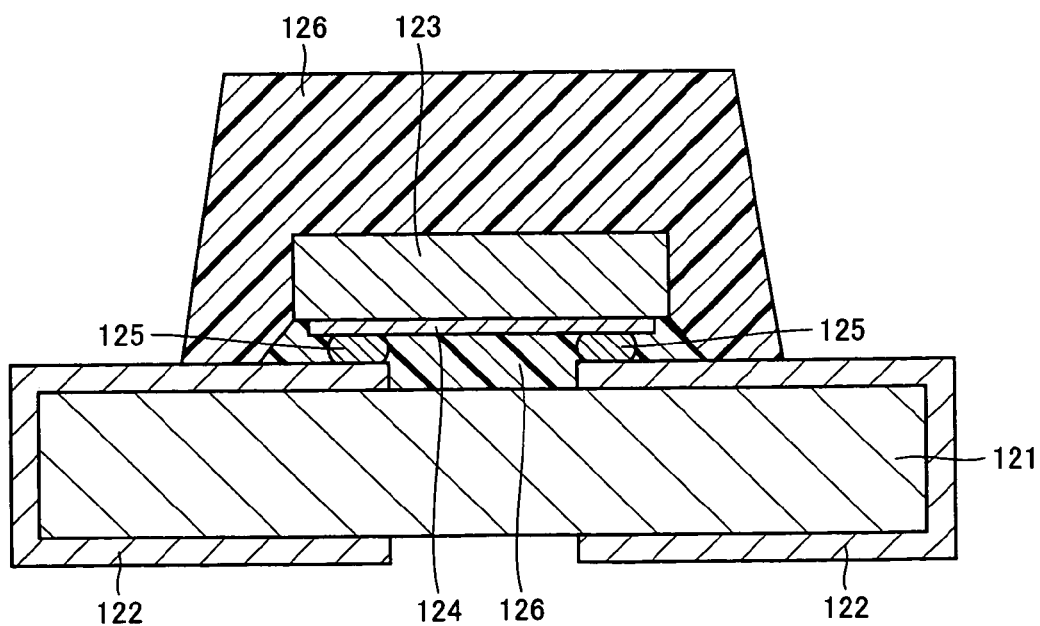

The light emitting device thus fabricated can be mounted on a lead frame, as shown in FIG. 10, by a conventional method and thus provide good production yield. Furthermore the device can extract light more efficiently than that using a conventional semi-transparent electrode and thus provide an optical output of approximately two times.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A light emitting nitride semiconductor device, comprising:
   a substrate,
   a semiconductor layer of a first conductivity type overlying said substrate,
   a light emitting layer overlying said semiconductor layer of said first conductivity type,
   a semiconductor layer of a second conductivity type overlying said light emitting layer, and
   a first electrode overlying said semiconductor layer of said second conductivity type,
   wherein said first electrode is configured to reflect light having a main light emission wavelength and to reflect a portion of light emitted from said light emitting layer, and the light emitting device is configured to release light from at least one side surface of the light emitting device.

2. The light emitting nitride semiconductor device according to claim 1, wherein said first electrode has a reflectance of at least 70% for said main light emission wavelength.

3. The light emitting nitride semiconductor device according to claim 1, wherein said first electrode covers at least 60% of a surface of said semiconductor layer of said second conductivity type.

4. The light emitting nitride semiconductor device according to claim 1, wherein said substrate is transparent to light having said main light emission wavelength.

5. The light emitting nitride semiconductor device according to claim 1, wherein a side of said substrate opposite said semiconductor layer of said first conductivity type has a surface that is non-parallel to said semiconductor layer of said first conductivity type or has a protrusion or a depression formed in said side.

6. The light emitting nitride semiconductor device according to claim 1, further comprising a substance having a high reflectance for said main light emission wavelength covering a surface of said substrate opposite said semiconductor of said first conductivity type.

7. The light emitting nitride semiconductor device according to claim 1, wherein said substrate is a sapphire substrate, a GaN substrate, or a SiC substrate.

8. The light emitting nitride semiconductor device according to claim 1, wherein said first electrode is a p type electrode containing Ag.

9. The light emitting nitride semiconductor device according to claim 1, further comprising a second electrode overlaying a back surface of said substrate, the second electrode comprising n type Al.

10. The light emitting nitride semiconductor device according to claim 1, wherein said semiconductor of said first conductivity type is an n type semiconductor and said semiconductor of said second conductivity type is a p type semiconductor.

11. The light emitting nitride semiconductor device according to claim 1, further comprising a second electrode located in the light emitting nitride semiconductor device substantially at a center, as seen from a top surface of the light emitting device downward.

12. The light emitting nitride semiconductor device according to claim 1, wherein a conical hole is formed on a side of said substrate opposite said semiconductor of said first conductivity type.

13. The light emitting nitride semiconductor device according to claim 12, wherein said conical hole is formed at a center of said side of said substrate opposite said semiconductor of said first conductivity type.

14. The light emitting nitride semiconductor device according to claim 1, further comprising:
   a second electrode; and
   a film having a high reflectance for said main light emission wavelength deposited on an upper surface of said semiconductor layer of said first conductivity type or said semiconductor layer of said second conductivity type at a portion not overlaid by said first electrode or said second electrode.

15. The light emitting nitride semiconductor device according to claim 6, wherein said substance of said high reflectance contains Ag or Al.

16. The light emitting nitride semiconductor device according to claim 14, wherein said substance of said high reflectance is a dielectric-containing multi-layer film.

17. The light emitting nitride semiconductor device according to claim 14,
   wherein said substance of said high reflectance has a reflectance of at least 70% for said main light emission wavelength.

18. The light emitting nitride semiconductor device according to claim 1, wherein said first electrode contains Ag and has a thickness of at least 10 nm.

* * * * *